（12）United States Patent　　　　(10) Patent No.: US 8,188,463 B2
Aurongzeb et al.　　　　　　　　　　　(45) Date of Patent: May 29, 2012

(54) ORGANIC LIGHT EMITTING DIODE WITH MAGNETIC STRUCTURE FOR IMPROVED CURRENT ADAPTABILITY

(75) Inventors: Deeder Aurongzeb, Mayfield Heights, OH (US); James Michael Kostka, Mayfield Heights, OH (US)

(73) Assignee: General Electric Company, Schenectady, NY (US)

( * ) Notice: Subject to any disclaimer, the term of this patent is extended or adjusted under 35 U.S.C. 154(b) by 21 days.

(21) Appl. No.: 12/621,817

(22) Filed: Nov. 19, 2009

(65) Prior Publication Data

US 2011/0114924 A1　　May 19, 2011

(51) Int. Cl.
*H01L 51/54*　　(2006.01)
(52) U.S. Cl. ....... 257/40; 257/98; 257/94; 257/E51.018; 257/E21.158; 257/E33.062
(58) Field of Classification Search .................... 257/40, 257/94, 98, E51.018, E21.158, E33.062
See application file for complete search history.

(56) References Cited

U.S. PATENT DOCUMENTS

| 6,800,999 | B1 | 10/2004 | Duggal et al. |
| 7,362,547 | B2 * | 4/2008 | Freitag et al. ............. 360/324.11 |
| 7,498,603 | B2 | 3/2009 | Rogojevic et al. |
| 2009/0066232 | A1 | 3/2009 | Koo et al. |
| 2009/0250712 | A1 * | 10/2009 | Xuan ............................... 257/94 |
| 2010/0231116 | A1 | 9/2010 | Ochi |

FOREIGN PATENT DOCUMENTS

| WO | 2008/059185 A2 | 5/2008 |
| WO | 2009/081992 A1 | 7/2009 |

OTHER PUBLICATIONS

WO Search Report issued in connection with corresponding WO Patent Application No. US10/52295 filed on Oct. 12, 2010.

* cited by examiner

*Primary Examiner* — Long Pham
(74) *Attorney, Agent, or Firm* — Fay Sharpe LLP (57) ABSTRACT

An organic light emitting device includes a cathode and an optional substrate external to the device. The device further includes at least one film layer disposed on at least one of the cathode or the substrate. The at least one film layer includes at least one of a magnetic, a mixed magnetic material, and combinations thereof. The device further includes an anode and at least one organic layer intermediate the cathode and anode.

27 Claims, 9 Drawing Sheets

ORGANIC LIGHT EMITTING DIODE WITH MAGNETIC STRUCTURE FOR IMPROVED CURRENT ADAPTABILITY

BACKGROUND OF THE DISCLOSURE

The present disclosure relates to a light application, and more specifically to a cathode structure. The cathode structure finds particular application in large area organic light emitting devices, although it will be appreciated that selected aspects may find use in related applications encountering the same issues of degradation due to current fluctuation during run-up, dimming or cycling.

An organic light emitting device (OLED) is a type of a light emitting diode that emits light in response to an applied potential. A typical OLED comprises an anode, one or more organic material layers and a cathode. Cathodes generally comprise a material having a low work function such that a relatively small voltage causes the emission of electrons. Some commonly used material include metals, such as gold, gallium, indium, manganese, tin, led, aluminum, silver, magnesium, a silver/magnesium alloy or combinations thereof. Such materials, although having a low work function, exhibit relatively low melting points and/or exhibit high degradation when exposed to oxygen or water. Anodes generally comprise a transparent material having high work function value such as indium tin oxide (ITO), tin oxide, nickel, or gold. A layer of molybdenum oxide ($MoO_3$) may be included to reduce the overall driving voltage.

One of the layers of the OLED comprises a material having the ability to transport holes, and is referred to as the hole transport layer. Another layer typically comprises a material having the ability to transport electrons, known as the electron transport layer. This layer may also function as the luminescent material (or emission layer) or an additional independent layer may be disposed between the hole transport layer and the electron transport layer. When a voltage is applied, a current of electrons flow through the device from the cathode to the anode. The anode injects positive charges (holes) into the hole transport layer, while the cathode injects negative charges (electrons) into the electron transport layer. Electrostatic forces bring the electrons and the holes together and they recombine near the light emitting layer, which causes a drop in energy levels and an emission of radiation in the range of visible light.

Organic light emitting diodes are currently used for display applications and are planned for use in general lighting applications. An OLED device includes one or more organic light emitting layers disposed between two electrodes, e.g., a cathode and a light transmissive anode, formed on a light transmissive substrate. The organic light emitting layer emits light upon application of a voltage across the anode and cathode. Upon the application of a voltage from a voltage source, electrons are directly injected into the organic layer from the cathode, and holes are directly injected into the organic layer from the anode. The electrons and the holes travel through the organic layer until they recombine at a luminescent center. This recombination process results in the emissions of a photon, i.e., light.

Large area OLED devices typically combine many individual OLED devices on a single substrate or a combination of substrates with multiple individual OLED devices on each substrate. Applications for large area OLED devise include lighting. For most of these applications, alternating current (AC) power is most readily available. However, OLEDs have rectifying current/voltage characteristics and so are typically operated with direct current (DC) power wired with the correct polarity for light emission. In these applications, AC power is converted to DC power to operate the large area OLEDs.

However, current OLED technologies for current driven devices exhibit power control problems. Eddy current is caused when a conductor is exposed to a changing magnetic field due to relative motion of the field source and conductor. When a conductor moves relative to the field generated by a source, electromotive forces (EMFs) can be generated around loops within the conductor. These EMFs acting on the resistivity of the material generate a current around the loop, in accordance with Faraday's law of induction. These currents dissipate energy, and create a magnetic field that tends to oppose the changes in the field. Therefore, when a moving conductor experiences changes in the magnetic field generated by a stationary object, as well as when a stationary conductor encounters a varying magnetic field, an eddy current is formed. This is a problem for organic light emitting devices (OLEDs). This can induce eddy current and create degradation in the organic layer and organic/cathode interface. There may be also reduce efficiency of the device by reducing charge injection efficiency and induce quenching of light.

Furthermore, large area OLEDs may include a single device or devices that can be connected to form large area OLEDs having a large capacitance. Capacitance is the ability of a body to hold an electrical charge. It is also a measure of the amount of electric charge stored (or separated) for a given electric potential. Due to a large capacitance, current flow through the device may overshoot or reflect a large fluctuation in current. The overshoot or large fluctuation in current can cause damage to the OLED by dissociating the organic layer and/or burning the cathode structure which is typically aluminum. This can even be more detrimental for large area devices as the capacitance can increase with area.

Significant efforts have been made in selecting materials and forming modified layer structures or materials in OLEDs to achieve improved performance. Numerous OLEDs with alternative layer structures have been disclosed. For example, OLEDs have been created containing additional functional layers. Some of these new layer structures with new materials have indeed resulted in improved device performance.

Even in light of recent advances, there is a continued need to improve OLED structure by reducing the eddy current and large fluctuations in current, thereby further enhancing the performance and efficiency of an OLED for use as a light source.

SUMMARY OF THE DISCLOSURE

In one aspect, the present disclosure relates to an organic light emitting device including a cathode with at least one film layer supported on at least the cathode or a substrate external to the device. The at least one film layer includes at least one of a magnetic material, a mixed magnetic material, and combinations thereof. The device further includes an anode and at least one organic layer intermediate the cathode and anode.

In another aspect, the organic light emitting device is an alternating current device.

In another aspect, the organic light emitting device is a direct current driven device.

In another aspect, the present disclosure relates to a method of manufacturing an organic light emitting device. The method includes the step of forming a cathode predominantly comprising aluminum. The method further includes the step of disposing at least one film layer on a surface of the cathode. The at least one film layer includes at least one of a magnetic material, a mixed magnetic material, and combination thereof. The method further includes the step of forming an anode and at least one organic layer intermediate the cathode and anode wherein the device is an alternating current driven device.

In yet another aspect, the present disclosure relates to a method of manufacturing an organic light emitting device. The method includes the step of forming a cathode predominantly comprising aluminum. The method further includes disposing at least one film layer on a surface of a substrate external to the device. The at least one film layer includes at least one of a magnetic material, a mixed magnetic material, and combinations thereof. The method further includes the step of randomly mixing an oxide within the at least one film layer forming a composite layer. The method further includes the step of forming an anode and at least one organic layer intermediate the cathode and anode wherein the device is a direct current driven device.

A primary benefit realized by the organic light emitting device is an increase in reliability and efficiency.

Another benefit realized by the organic light emitting device is the ability to reduce or eliminate the effects of eddy current in an alternating current (AC) driven device.

Still another benefit realized by the organic light emitting device is the ability to reduce fluctuating current in a direct current (DC) driven device.

Yet another benefit realized by the organic light emitting device is reduced degradation in the organic layer and organic/cathode interface.

Still other features and benefits of the organic light emitting device according to the invention will become more apparent from reading and understanding the following detailed description.

DETAILED DESCRIPTION OF THE PREFERRED EMBODIMENTS

Aspects of the exemplary embodiment relate to an organic light emitting device (OLED), a light source including an OLED, and to a method of manufacturing an OLED. It is to be appreciated that the exemplary OLED may be used for any known purpose; however, it finds particular application in general lighting and illumination applications.

In one exemplary embodiment, an OLED includes an anode and a cathode, and at least one film layer disposed on at least the cathode or a substrate external to the device. The OLED may include various other layer combinations, including adding or removing layers. The at least one film layer includes at least one of a magnetic material, a mixed magnetic material, and combinations thereof. It is to be appreciated, however, that the OLED may comprise numerous configurations that vary in the number, type and order of the organic layers.

Figure 1:
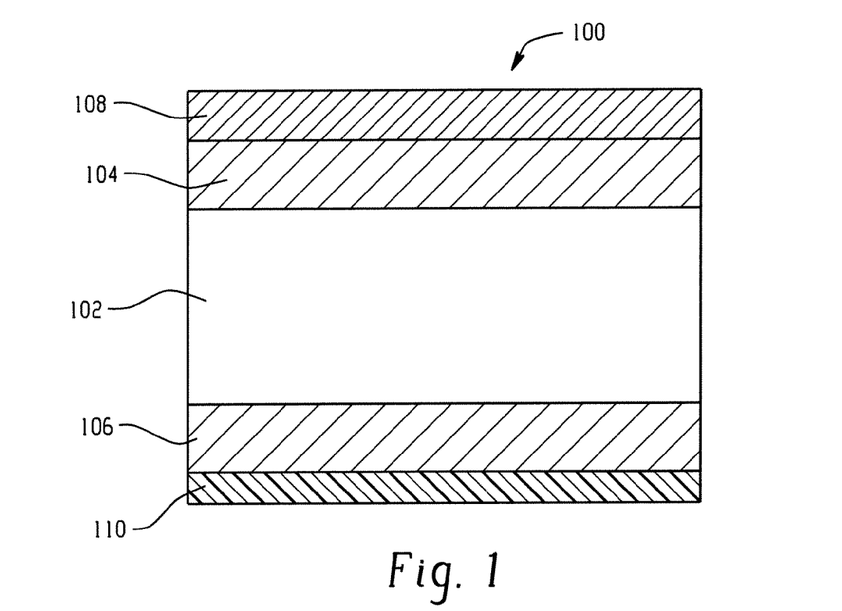
FIG. 1 is a cross-sectional view of an organic light emitting device (OLED) 100 according to one exemplary embodiment.

FIG. 1 represents an OLED 100 in accordance with one exemplary embodiment. OLED 100 may include various organic layer(s) 102, as known in the art, disposed between two electrodes, namely a cathode 104 and an anode 106. Disposed on the surface of the cathode 104 is at least one film layer 108. The OLED 100 may be supported on a substrate 110. In an exemplary embodiment, the at least one film layer may include a magnetic material, a mixed magnetic material, and combinations thereof. In some embodiments, the OLED 100 is an alternating current (AC) device and in other embodiments it may comprise a direct current (DC) operating device.

In one embodiment, the OLED is an AC operating device and the cathode 104 is predominantly aluminum, i.e. >50% aluminum, and at least >80% aluminum. Aluminum has a relatively high heat and oxidation resistance, thereby improving the OLED's ability to withstand various elements, i.e., oxygen and water. The aluminum layer may have a thickness of at least 25 nanometers (nm); e.g., at least 50 nm. The aluminum layer may further have a thickness of less than about 200 nm, e.g., a thickness of approximately 100 nm. The cathode 104 may be aluminum exclusively or another metallic material exclusively or the cathode 104 may include aluminum with one or more metallic materials. Examples of such other materials include metallic materials, such as lithium, magnesium, strontium, barium, silver, indium, tin, zinc, zirconium, samarium, europium, alloys thereof, and mixtures thereof.

In one embodiment, the at least one film layer 108 is manganese. Manganese is a type of magnetic material, that is, when placed within a magnetic field, the magnetic forces of the material's electrons are affected and they reduce the effect of magnetic field that induces eddy current throughout the device through the organic/cathode interface in particular. In order to reduce the effects of eddy current and degradation in the organic layer at the organic layer/cathode layer interface of an alternating current driven device, the manganese layer is disposed on the aluminum cathode layer. The manganese film layer 108 may have a thickness of at least 100 nanometers (nm); e.g., at least 200 nm. The manganese film layer 108 may further have a thickness of less than about 500 nm, e.g., a thickness of approximately 250 nm. The at least one film layer 108 may be manganese or cobalt exclusively or the at least one film layer 108 may include one of a magnetic material and mixed magnetic composition selected from the group of manganese, nickel, cobalt, iron, nickel-cobalt, nickel-aluminum, iron-platinum, manganese (tetracyano-p-quinodimethane)$_2$, iron (tetracyano-p-quinodimethane)$_2$, cobalt (tetracyano-p-quinodimethane)$_2$, nickel (tetracyano-p-quinodimethane)$_2$, and combinations thereof.

Figure 2:
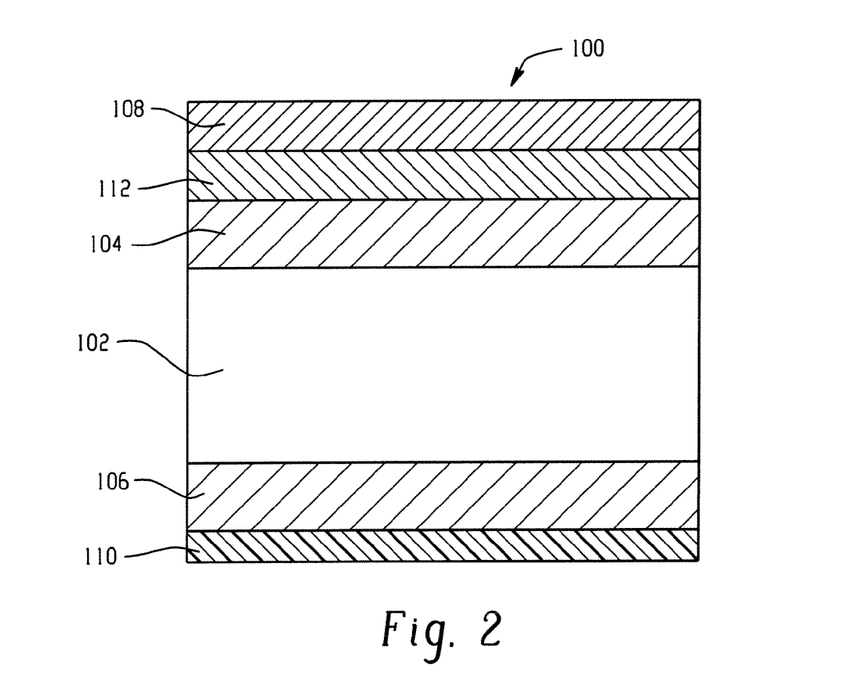
FIG. 2 is a cross-sectional view of an OLED 100 according to another exemplary embodiment.

The OLED may further include a second film layer 112 as illustrated in FIG. 2. In one exemplary embodiment, the second film layer 112 is disposed between the at least one film layer 108 and the cathode 104. The association of the second film layer 112 with the cathode 104 in a bi-layer may enable formation of an alloy. The formation of this alloy may allow for a reduction of diffusion of metals from the film layer into the organic layer 102. Small metal particles may diffuse inside the organic layer which can absorb light thereby reducing efficiency of the OLED. Furthermore, the small metal particles may react with the organic layer to form metal-organic complexes thus changing the organic layer composition forming a non-emissive layer and reducing efficiency of the OLED. In one embodiment of an AC driven operating OLED, the second film layer 112 comprises nickel. The at least one film layer 108 is at least one of a nickel-cobalt alloy, a nickel-aluminum alloy and combinations thereof. The at least one film layer and the second film layer 108, 112 may have a total thickness greater than the thickness of the cathode 104. The bi-layer is formed by slow diffusion of two dissimilar materials at the interface. The bi-layers may be more stable and may stop migration of the magnetic material into the organic material.

A substrate 110, as is known in the art, may be employed to provide support for the OLED. The substrate may comprise any suitable material known in the art, such as glass, silicon, or plastic. The exemplary substrate is optically transparent, allowing light generated in the device to pass therethrough. In one embodiment, the substrate has a thickness of at least about 0.1 mm; e.g., less than about 1.5 mm; e.g., 0.7 mm.

Figure 3:
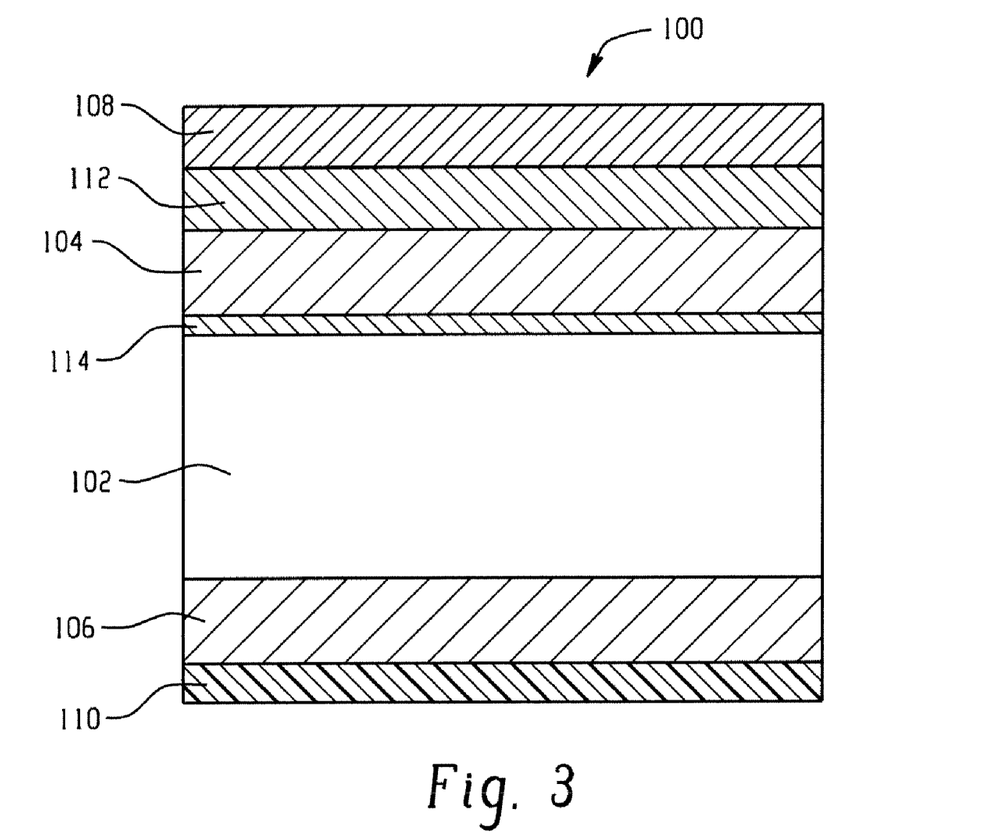
FIG. 3 is a cross-sectional view of an OLED 100 according to another exemplary embodiment.

The OLED may further include a third film layer 114 as illustrated in FIG. 3. In one exemplary embodiment, the third film layer 114 is disposed directly adjacent the cathode 104, creating a cathode bi-layer. The association of the third film layer 114 with the cathode 104 in a bi-layer improves the efficiency of electron ejection. It is proposed that the bi-layer can create an additional interface, which will slow the movement of current and thereby reduce the decay of organic material in the OLED. The third film layer 114 may have a thickness of at least 0.01 nm; e.g., at least 0.1 nm. In one embodiment, the thickness is no greater than 5 nm; e.g., 2 nm. The third film layer 114 may comprise a magnetic metal halide. The magnetic metal halide may be selected from the group consisting of, but not limited to, halides of nickel, silver, chromium, manganese, cesium, iron, and combinations thereof. Magnetic materials improve the efficiency of electron injection. In one embodiment, the metal is nickel and the halide is chosen from fluoride, iodide, or a combination thereof, although other halides may be used. Therefore, in this embodiment, the third film layer 114 is a nickel halide, the at least one film layer 108 comprises manganese, the second film layer 112 comprises a nickel-cobalt alloy, and the cathode 104 comprises aluminum. An interface match is more likely when a similar metal and corresponding metal halide are chosen. In one embodiment, the third film layer includes at least 10 wt. % or at least 25 wt. % magnetic halide, e.g., up to 100 wt. %.

It is to be understood, in keeping with the foregoing discussion regarding the formation of bi-layers between second film layer 112/cathode layer 104 and third film layer 114/cathode layer 104, that even if both second film layer 112 and third film layer 114 are present, the materials of these layers, when deposited adjacent cathode 104, may form the bi-layers discussed rendering a bi-layer at each interface.

In an exemplary embodiment, a light source such as a lamp includes at least one AC operating OLED 100 as described.

In another embodiment, a light source such as a luminaire fixture containing a magnet includes at least one AC operating OLED 100 as described.

In another embodiment, a light source such as a luminaire fixture containing a magnet includes at least one AC operating OLED 100 as described. The magnet can be utilized to manipulate the magnetic field near the device. This manipulation may provide for additional performance enhancements. The magnet can also provide mechanical support for holding the device and means of reliable electrical contact.

Figure 4:
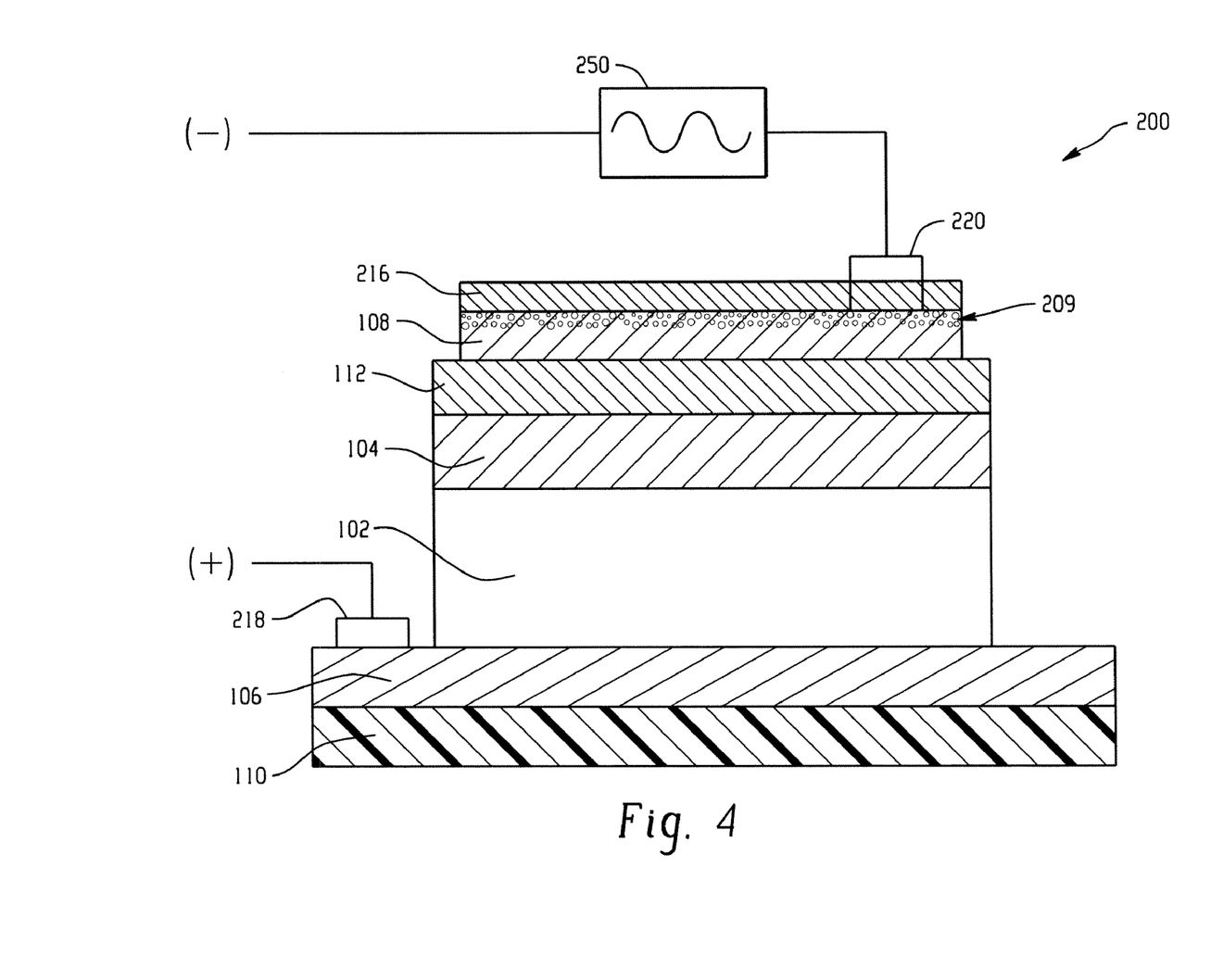
FIG. 4 is a cross-sectional view of an OLED 200 according to another exemplary embodiment.

With regard to FIG. 4, an organic light emitting device 200 is shown. It is to be appreciated that OLED 200 includes many similar features as previously described in connection with OLED 100 so that like reference numerals and components in the "200" series refer to like numerals and components in the "100" series of FIGS. 1, 2, and 3. In one embodiment, the OLED 200 is a DC operating device and the at least one film layer 108 is disposed on the cathode 104. The at least one film layer 108 may include a magnetic material, a mixed magnetic material, and combinations thereof.

In an embodiment in accord with FIG. 4, the at least one film layer 108 is manganese and includes an oxide randomly dispersed within the manganese to form a metal oxide layer 108/209. The metal oxide layer 108/209 can have the ability to reduce an overshoot or fluctuation in current flow in the OLED. The oxide may be present in the composite layer in an amount of at least 5 wt. %; e.g. at least 8 wt. %. The oxide may further be present in the metal oxide layer 108/209 in an amount of less than 15 wt. % of the composite layer 209, e.g. 10 wt. %. The particle size of the oxide may be at least 20 nm; e.g. at least 40 nm. The particle size is not greater than 100 nm, e.g., 60 nm. The oxide may include a metal oxide or a polymeric oxide or a combination thereof, and may be selected from the group of aluminum, iron, vanadium, barium, zirconium, chromium, indium-chromium, polyethylene, graphene, polyacetylene, oxides thereof, and combinations thereof. In one embodiment, the oxide is aluminum oxide.

Figure 5:
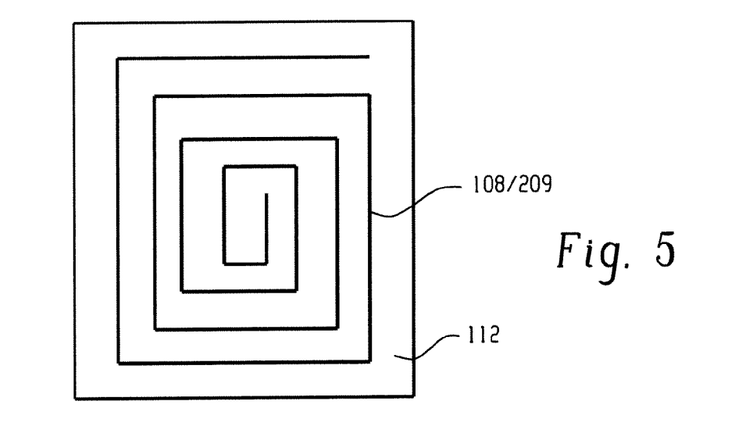
FIGS. 5-7 are perspective views of patterned composite layers according to another exemplary embodiment.
Figure 6:
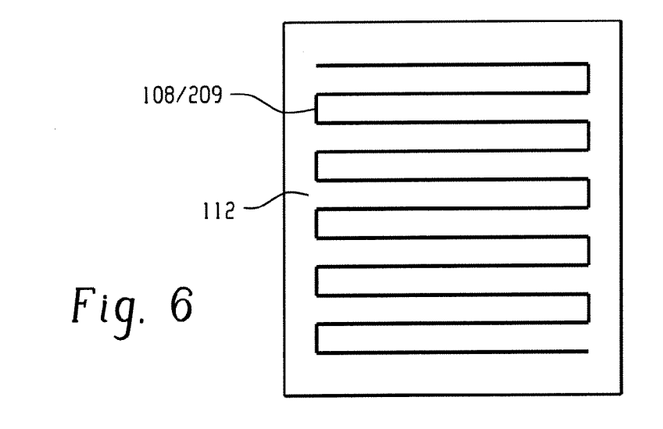
Figure 7:
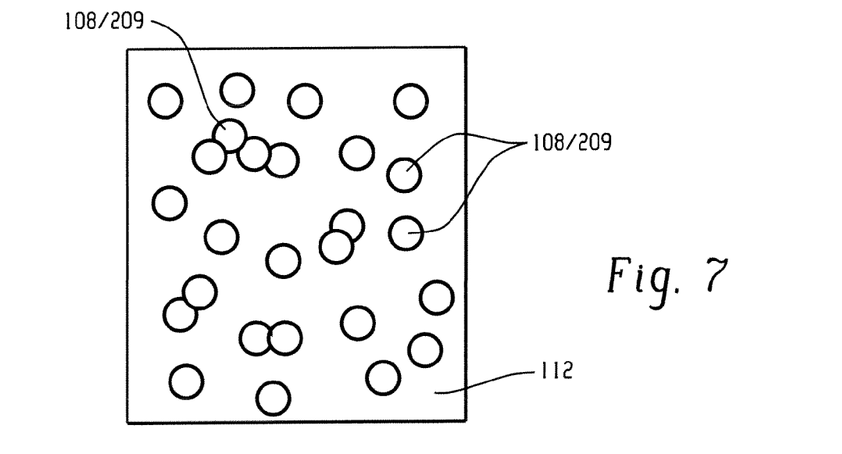

In another embodiment, the metal oxide layer 108/209 may have an ordered or disordered pattern as illustrated in FIGS. 5-7. It is known in the art that increasing pattern length, inductance and resistance can be increased. Therefore, by having an ordered or disordered (coil-like) pattern, inductance and resistance can be increased which is efficient for reducing current fluctuation. (It is known that copper wire may make large coils.)

The OLED may further include a second film layer 112 in order to provide more efficient contact. The metal oxide layer 108/209 may or may not have enough conductivity. Therefore, depositing a conductive layer will enhance conductivity if a metal oxide layer 108/209 is in use. In one embodiment, the second film layer 112 is disposed between the metal oxide layer 108/209 and the cathode 104. In another embodiment, a third film layer 216 is disposed on the metal oxide layer 108/209. The second and third film layers 112, 216 each may have a thickness of at least 20 nm; e.g., at least 30 nm. In one embodiment, the thickness is not greater than 60 nm; e.g., 50 nm. The second and third film layers 112, 216 may comprise a metal. The metal may be selected from the group consisting of gold, silver, nickel, and combinations thereof. In one embodiment, the second and third film layers 112, 216 are gold. Although, it may be appreciated the layers may be different. A connection with the OLED 200 can be made using external connectors 218, 220 comprising an aluminum alloy. The aluminum alloy may be composed of the following: (95 wt. % aluminum, $ZrO_2/Ta_2O_5$). It may be appreciated a connection with the OLED 100 can be made using similar external connectors, such as 218, 220 comprising an aluminum alloy.

Figure 8:
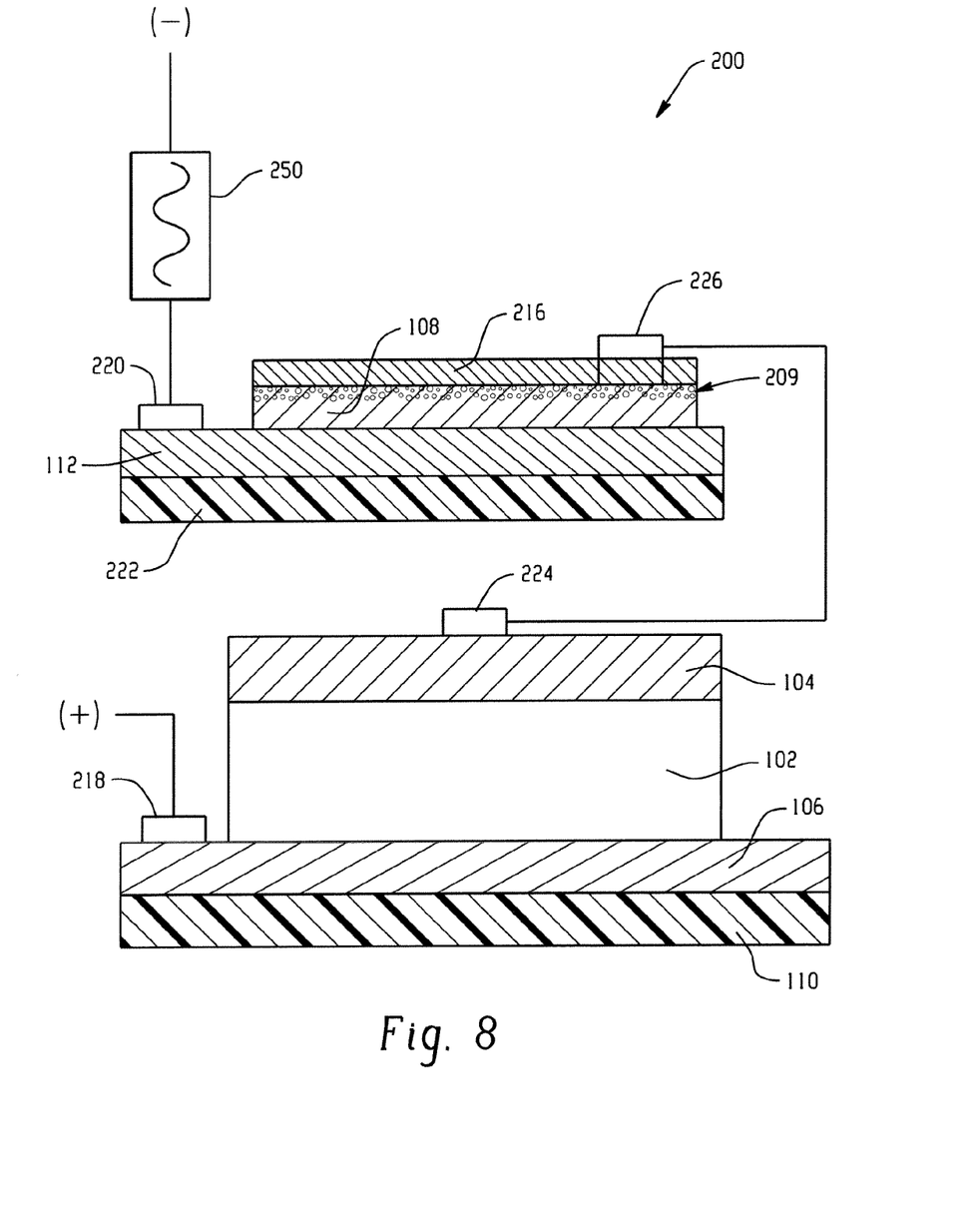
FIG. 8 is a cross-sectional view of an OLED 200 according to another exemplary embodiment.

FIG. 8 represents yet another embodiment of a DC operating OLED 200. In this embodiment, an external substrate 222 is positioned below a second film layer 112.

In an exemplary embodiment, the DC operating OLED 200 has a resistance of 50 to 200 ohms+/−20% when a fluctuating current is applied thereto and wherein the fluctuating current is at least greater than two percent of a nominal current. Nominal current is the optimal current of the device from which it is rated which can range from 5 mA to 1 A based on surface area of the device.

In an exemplary embodiment, the DC operating OLED 200 has an inductance of between 50 microhenries and 50 millihenries.

In an exemplary embodiment, a light source such as a lamp includes at least one DC operating OLED 200 as described.

In another embodiment, a light source such as a luminaire fixture containing a magnet includes at least one DC operating OLED 200 as described.

In another embodiment, a light source such as a luminaire fixture containing a magnet includes at least one DC operating OLED 200 as described. The magnet can be utilized to manipulate the magnetic field near the device. This manipulation may provide for additional performance enhancements. The magnet can also provide mechanical support for holding the device and means of reliable electrical contact.

The materials for layers 102, 108, 110, 112, 114, 108/209, 216, 222, or cathode 104 and anode 106 mentioned above are suitably deposited through any method known and commonly used in the art, such a vacuum deposition, thermal evaporation, vapor-phase deposition and inkjet printing among others.

Without intending to limit the scope of the exemplary embodiments presented, the following example demonstrates the benefit of a metal oxide layer 108/209.

EXAMPLE

Example 1

An OLED 200 was formed according to the structure shown in FIG. 8. For the benefit of the reader, layers of the device are numbered herein in accord with FIGS. 1-4. An aluminum cathode 104 was deposited above an organic layer 102. The OLED 200 further included an indium-titanium oxide (ITO) anode 106 and a support substrate 110.

The external substrate 222 composed of polyethylene terephthalate (PET) was sonicated in deionized water and cleaned in ethanol. This was followed by drying the substrate 222 at 70° C. for 30 minutes. Approximately 50 nm of a gold film layer 112 was deposited on the substrate 222 in a $10^{-5}$ ton vacuum sputtering chamber. A 200 nm manganese film layer 108 was formed by depositing the layer using the same chamber. A metal oxide layer 108/209 was prepared by sedimentation of colloidal $Al_2O_3$ extracted from a 50 wt. % alcohol solution. The $Al_2O_3$ was disposed on the manganese film layer 108 to form the $Mn/Al_2O_3$ film layer 108/209. The randomly dispersed metal oxide, $Al_2O_3$, within the manganese film layer 108 was verified to be less than 50% using a microscope. The system was then annealed at 100° C. for 20 minutes in a convection oven to drive out the water/solvents and to form compact films. Approximately 50 nm of a gold film layer 216 was deposited on the Mn/Al2O3 layer 108/209. The external substrate 222 was connected in series with a power supply as shown in FIG. 8. The patch connectors 218, 220, 224 and 226 were composed of an aluminum alloy of the following (95 wt. % Al, 5 wt. % $ZrO_2/Ta_2O_5$).

A current sensing oscilloscope 250 was positioned in series. The system was driven with a direct current (DC) power supply of 15 volts (V) to supply the OLED with 50 milliamperes (mA).

Figure 9:
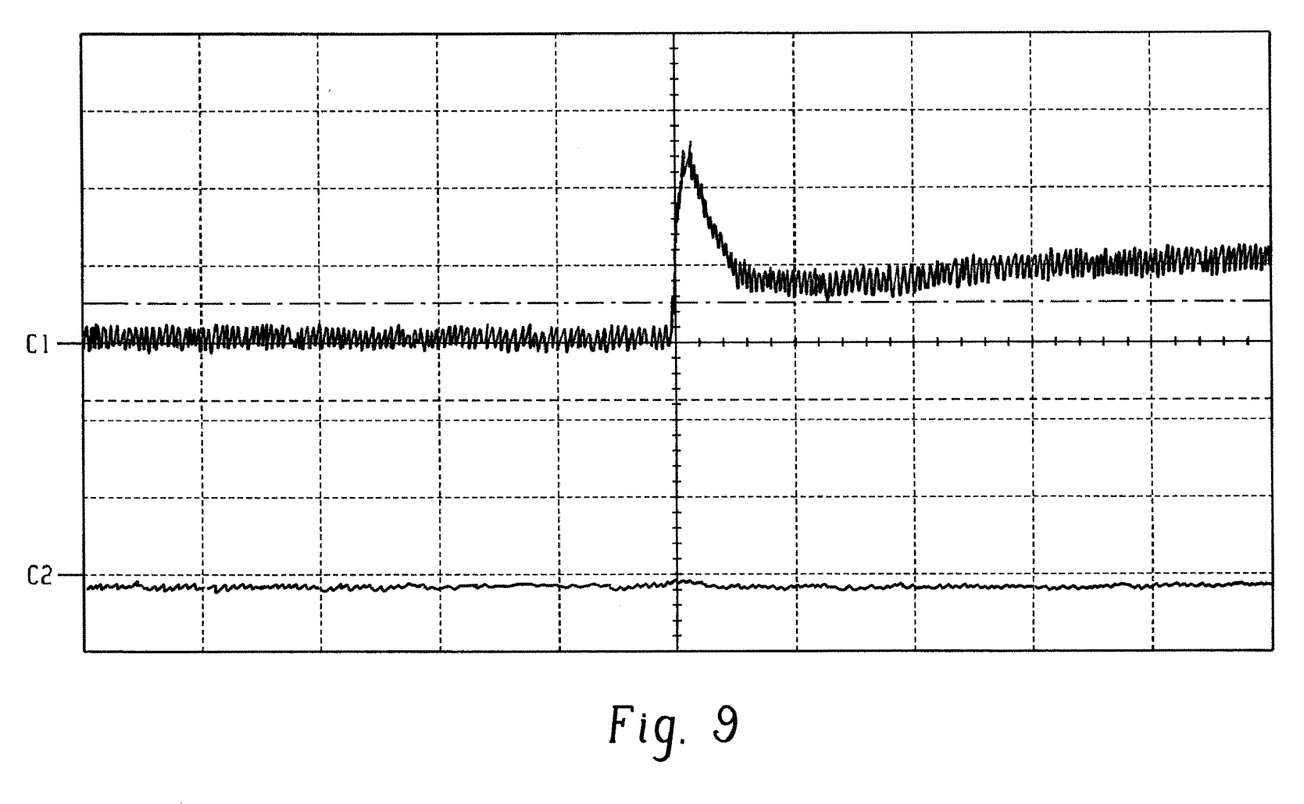
FIG. 9 is a graphical representation of current fluctuation rate of a known in the art OLED.
Figure 10:
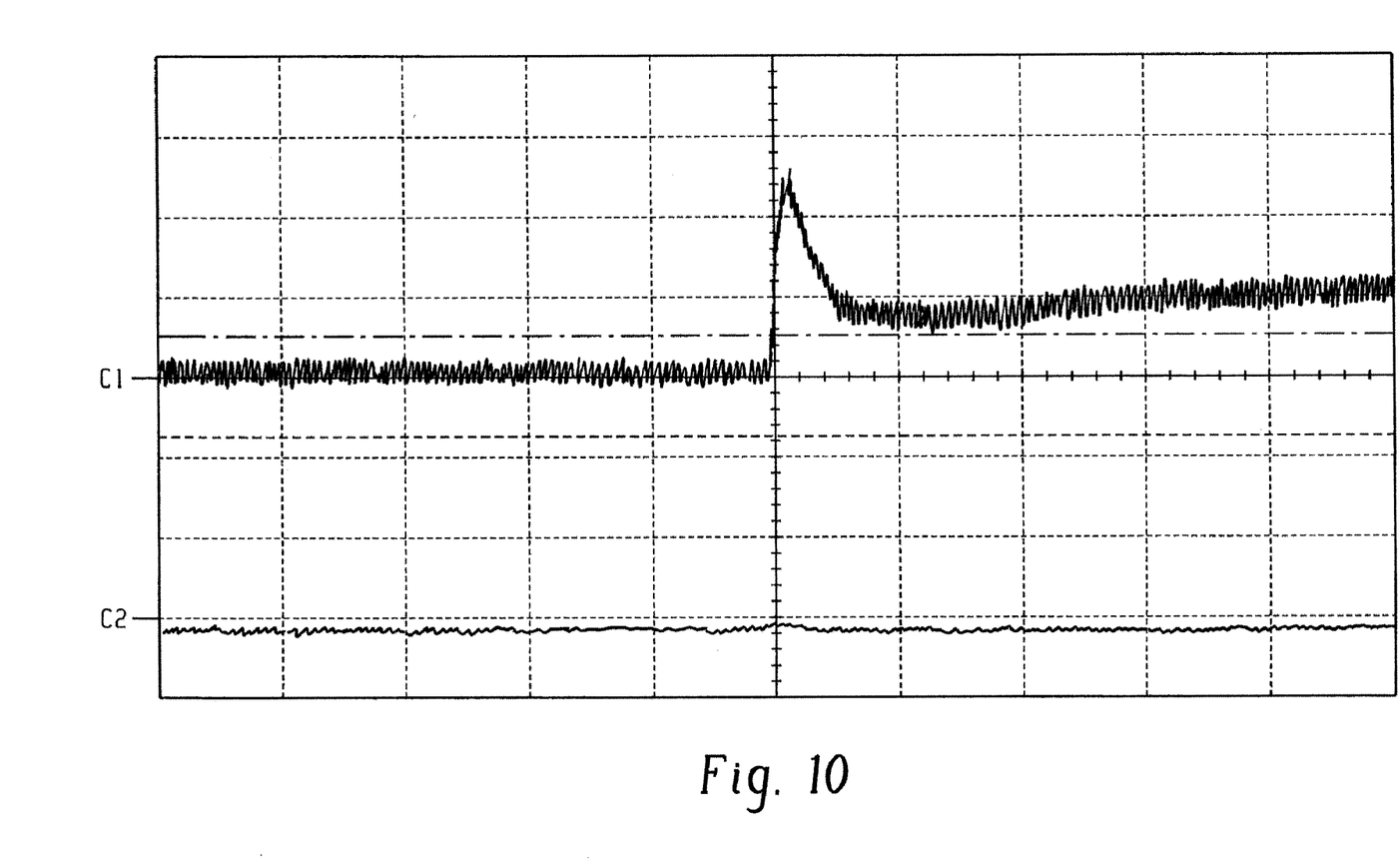
FIG. 10 is a graphical representation of current fluctuation rate according to an example embodiment of an OLED 200 (without a metal oxide layer) of the present disclosure.
Figure 11:
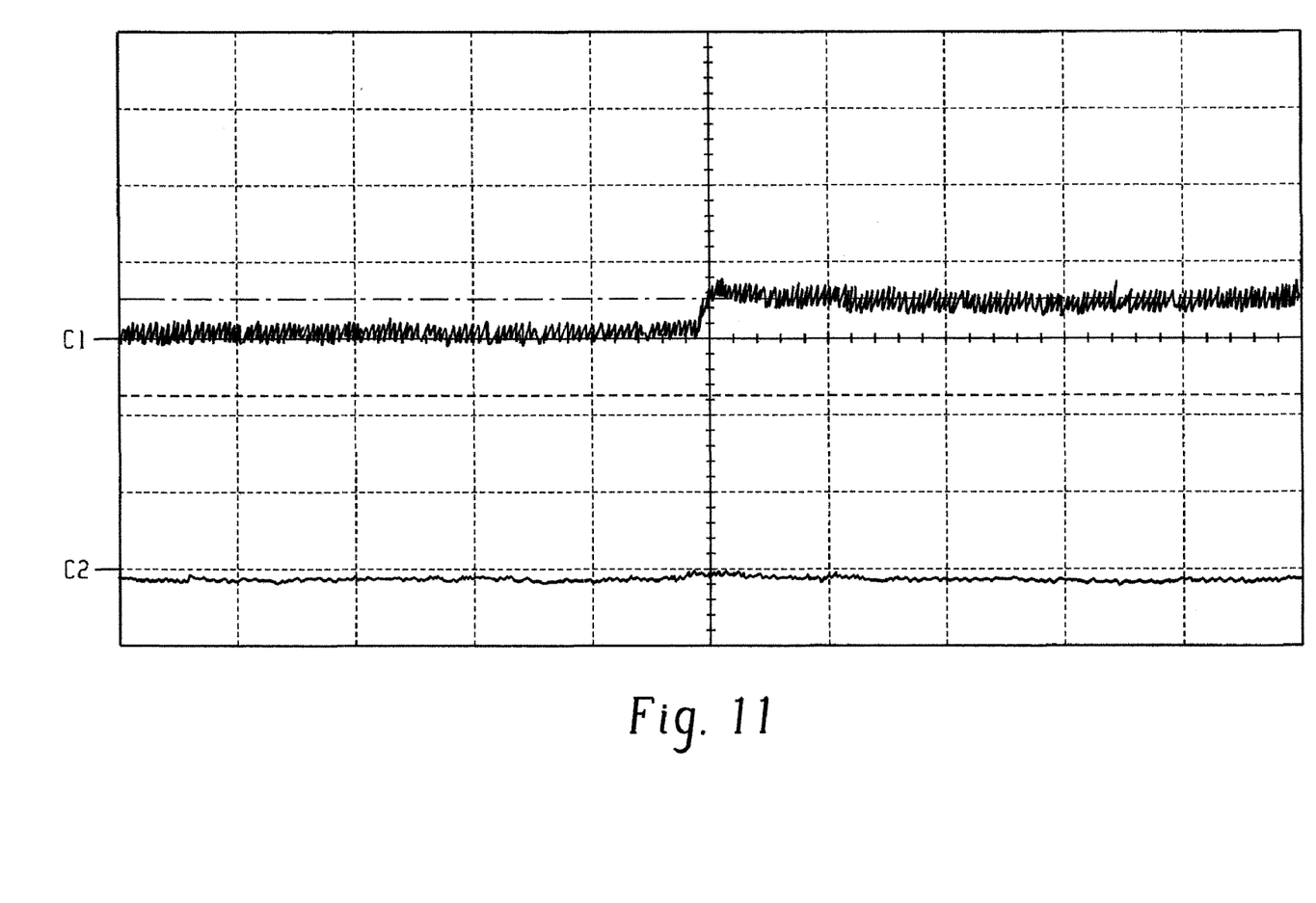
FIG. 11 is a graphical representation of current fluctuation rate according to an example embodiment of an OLED 200 of the present disclosure.
Figure 12:
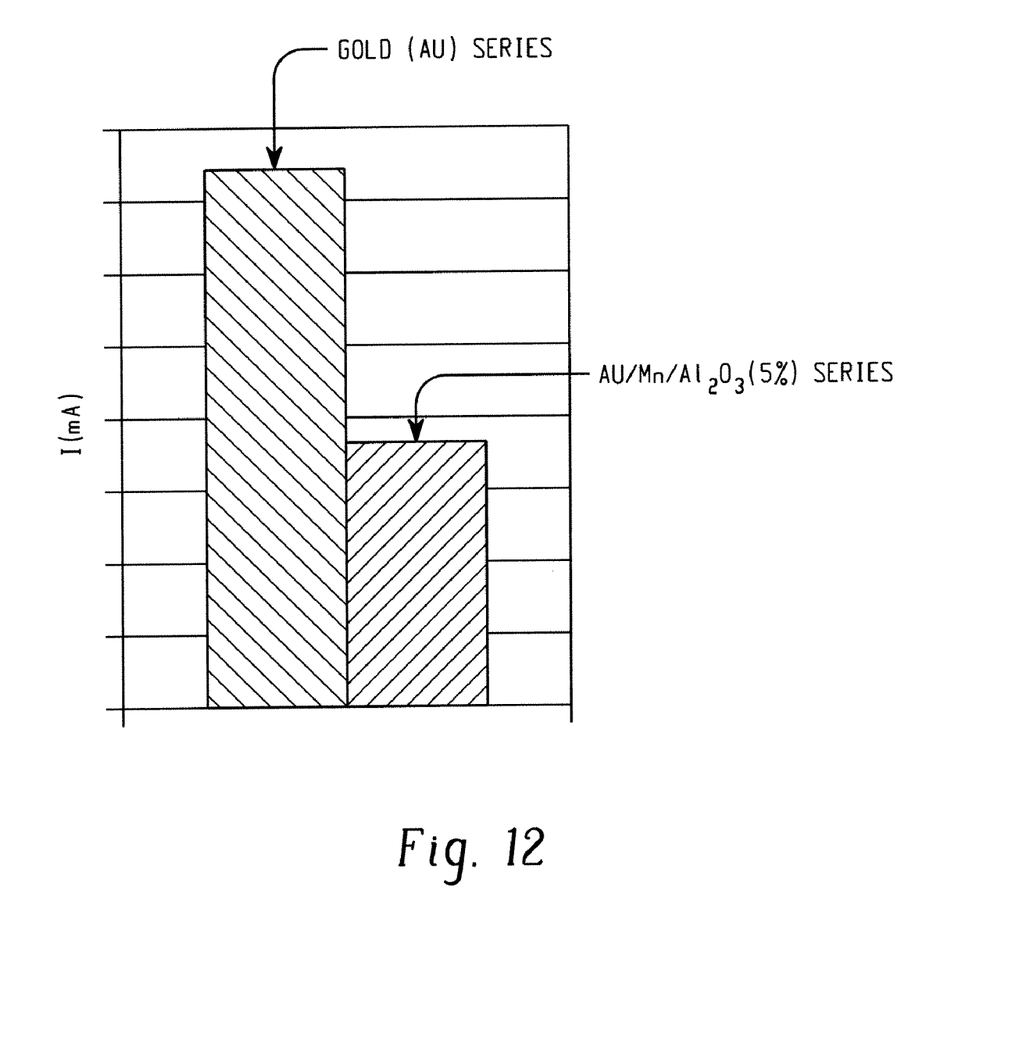
FIG. 12 is a summary graphical representation of current fluctuation rate as illustrated in FIGS. 10 and 11 according to an example embodiment of an OLED 200.

FIG. 9 illustrates the start up and steady state current recorded with an OLED known in the art. FIG. 10 illustrates the current record for the OLED 200 formed as illustrated in FIG. 8 with a 50 nm gold layer 112. The metal oxide layer 108/209 was not disposed intermediate to the gold layer 112 and external substrate 222. The current record set forth in FIG. 10 is similar to FIG. 9. FIG. 11 illustrates the current record for the OLED 200 as prepared in EXAMPLE 1 and shows a reduction in current spike. FIG. 12 illustrates the summary of reduction in current spike for the score traces shown in FIGS. 10 and 11. The difference may be attributed to inductance and resistance of the metal oxide layer 108/209.

The invention has been described with reference to the preferred embodiments. Obviously, modifications and alterations will occur to others upon reading and understanding the preceding detailed description. It is intended that the invention be construed as including all such modifications and alterations.

What is claimed is:

1. An organic light emitting device comprising:
   a cathode;
   a substrate;
   at least one film layer disposed on the cathode, the at least one film layer comprising at least one of a magnetic material, a mixed magnetic material, and combinations thereof;
   a second film layer disposed intermediate the at least one film layer and cathode;
   an anode; and
   at least one organic layer intermediate the cathode and anode, wherein the device is an alternating current driven device and the at least one film layer and the second film layer have a total thickness greater than the thickness of the cathode.

2. The device of claim 1, wherein the at least one film layer comprises at least one of a magnetic material and a mixed magnetic material selected from the group consisting of manganese, nickel, iron, nickel-cobalt, nickel-aluminum, iron-platinum, iron-aluminum, manganese (tetracyano-p-quinodimethane)$_2$, iron (tetracyano-p-quinodimethane)$_2$, cobalt (tetracyano-p-quinodimethane)$_2$, nickel (tetracyano-p-quinodimethane)$_2$, and combinations thereof.

3. The device of claim 1, wherein the at least one film layer comprises manganese.

4. The device of claim 1, wherein the at least one film layer has a thickness of between 25 nm and 500 nm.

5. The device of claim 1,
   wherein the second film layer comprises a metal selected from the group consisting of iron, nickel, cobalt, and combinations thereof.

6. The device of claim 1, wherein the cathode predominantly comprises aluminum.

7. The device of claim 1, wherein the cathode has a thickness of between 50 and 200 nm.

8. The device of claim 5, further comprising a third film layer disposed directly adjacent the cathode;
   wherein the third film layer comprises at least one metal halide selected from the group consisting of nickel, silver, chromium, manganese, cesium, iron, halides thereof, and combinations thereof.

9. A light source comprising at least one organic light emitting device comprising the device claim 1.

10. An organic light emitting device comprising:
    a cathode;
    a substrate;

at least one film layer disposed on the cathode, the at least one film layer comprising a magnetic material and an oxide;

an anode; and at least one organic layer intermediate the cathode and the anode, wherein the device is a direct current driven device.

11. The device of claim 10, wherein the at least one film layer is electrically connected to the device in series.

12. The device of claim 10, wherein the oxide comprises at least one of a metal and a polymeric oxide selected from the group consisting of aluminum, iron, vanadium, barium, zirconium, chromium, indium-chromium, polyethylene, graphene, polyacetylene, oxides thereof, and combinations thereof.

13. The device of claim 10, wherein the oxide is aluminum oxide.

14. The device of claim 10, wherein the oxide comprises between 5 and 15 weight percent of the at least one film layer.

15. The device of claim 10, further comprising a second film layer;

wherein the second film layer is disposed intermediate the at least one film layer and the external substrate.

16. The device of claim 15 further comprising a third film layer;

wherein the third film layer is disposed on the at least one film layer.

17. The device of claim 16, wherein the second and third film layers each comprise a metal selected from the group of gold, silver, nickel and combinations thereof.

18. The device of claim 16, wherein the second and third film layers comprise gold.

19. The device of claim 16, wherein the second and third film layers each have a thickness of between 20 and 100 nm.

20. The device of claim 18, wherein the device has a resistance of 50 to 200 ohms+/−20% when a fluctuating current is applied thereto; and wherein the fluctuating current is at least greater than two percent of a nominal current.

21. A luminaire fixture comprising at least one organic light emitting device comprising the device of claim 1, wherein the luminaire fixture comprises a magnet.

22. A luminaire fixture comprising at least one organic light emitting device comprising the device of claim 10, wherein the luminaire fixture comprises a magnet.

23. The device of claim 10, wherein the at least one film layer comprises at least one of a magnetic material and a mixed magnetic material selected from the group consisting of manganese, nickel, iron, nickel-cobalt, nickel-aluminum, iron-platinum, iron-aluminum, manganese (tetracyano-p-quinodimethane)$_2$, iron (tetracyano-p-quinodimethane)$_2$, cobalt (tetracyano-p-quinodimethane)$_2$, nickel (tetracyano-p-quinodimethane)$_2$, and combinations thereof, and an oxide selected from the group consisting of oxides of aluminum, iron, vanadium, barium, zirconium, chromium, indium-chromium, polyethylene, graphene, polyacetylene, and combinations thereof.

24. The device of claim 10, further comprising a second film layer, wherein the second film layer is disposed intermediate the at least one film layer and the cathode.

25. The device of claim 24, further comprising a third film layer, wherein the third film layer is disposed on the at least one film layer.

26. The device of claim 25, wherein the second and third film layers each comprise a metal selected from the group consisting of gold, silver, nickel and combinations thereof.

27. A luminaire fixture comprising at least one organic light emitting device comprising the device of claim 10, wherein the luminaire fixture comprises a magnet.

* * * * *